United States Patent [19]

Alcorn et al.

[11] 3,995,307

[45] Nov. 30, 1976

[54] INTEGRATED MONOLITHIC SWITCH FOR HIGH VOLTAGE APPLICATIONS

[75] Inventors: Charles Noble Alcorn; Robert Joseph DeFilippi, both of Reston; John David Henke; Robert Ng Liang, both of Manassas, all of Va.

[73] Assignee: International Business Machines Corporation, Armonk, N.Y.

[22] Filed: Feb. 26, 1975

[21] Appl. No.: 553,375

Related U.S. Application Data

[62] Division of Ser. No. 429,307, Dec. 28, 1973, Pat. No. 3,896,317.

[52] U.S. Cl. ................................... 357/46; 357/40; 357/43; 357/51; 307/304; 307/315; 307/254
[51] Int. Cl.² .................. H01L 27/10; H03K 27/02; H03K 3/353; H03K 3/26
[58] Field of Search .................... 307/304, 315, 254; 357/51, 46, 40, 43

[56] References Cited

UNITED STATES PATENTS

| | | |
|---|---|---|
| 3,500,140 | 3/1970 | Makimoto et al. ............... 307/315 |
| 3,702,947 | 11/1972 | Schilling ............................ 307/315 |
| 3,725,754 | 4/1973 | Furuhashi ......................... 307/315 |
| 3,770,519 | 11/1973 | Wiedmann ........................ 357/46 |

*Primary Examiner*—Andrew J. James
*Attorney, Agent, or Firm*—J. C. Redmond, Jr.

[57] ABSTRACT

An integrated monolithic switch is fabricated in an epitaxial layer united to a semiconductor substrate. The switch includes a Darlington amplifier, a power output switch, a bilateral device, typically a diffused diode, and an epitaxial resistor, the combination being connected between a set of high voltage lines. The epitaxial layer has an appropriate thickness and resistivity to accommodate all active and passive elements. For a first input signal, the switch is connected to one high voltage line. For a second input signal, the switch is connected to the other high voltage line. The switch is adapted to sink current. The diode structure, when forward biased by the sinking current, forms a parasitic path to direct the sinking current to the substrate even though the high voltage lines are up. The Darlington is connected to the switch output to lower output voltage during the sinking condition.

A set of switches of the same conductivity type may be employed to drive a cross point in a gas panel display.

15 Claims, 8 Drawing Figures

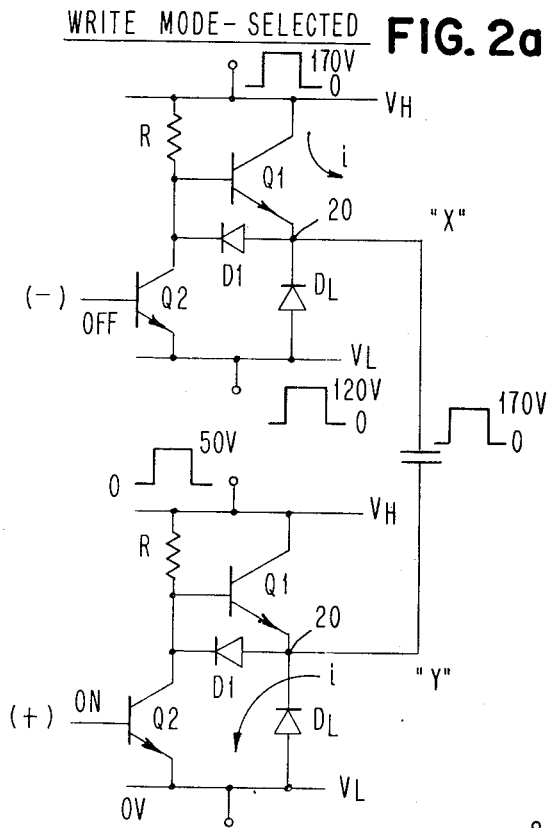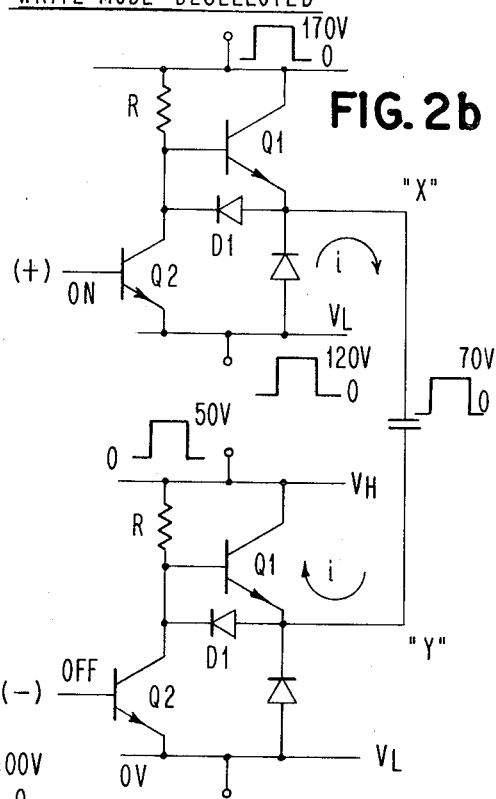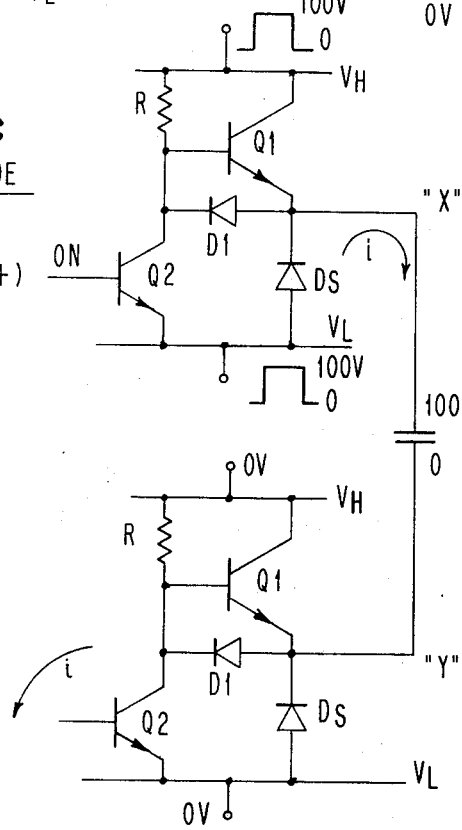

INTEGRATED MONOLITHIC SWITCH FOR HIGH VOLTAGE APPLICATIONS

This is a division of application Ser. No. 429,307, filed Dec. 28, 1973, now U.S. Pat. No. 3,896,317.

BACKGROUND OF THE INVENTION

1. Field of the Invention

This invention relates to an integrated monolithic switch for high voltage applications. More particularly, the invention relates to drivers for gas panel displays.

2. Description of the Prior Art

Gas panel displays require voltages of the order of 100 to 200 volts to write, erase and sustain information on the display. The information is displayed by selectively applying high voltages to row and column conductors of the matrix of cross points incorporated into the panel. Each cross point is controlled by a set of high voltage switches, one switch controlling an "x" input and the other switch controlling a "y" input. Logic decoders select the "x" and "y" switches for write or erase modes of the panel.

Integrated semiconductor switches for high voltage applications, e.g. gas panel displays are known in the art as evidence by U.S. Pat. No. 3,614,739. Typically, such integrated switches translate a low level signal to the required high voltage. The output is the algebraic sum of a periodic sustaining voltage and a level converted logic signal. The signal translation requires, however, that the integrated switches for the "x" and "y" drivers be of different conductivity types, i.e. one NPN and the other PNP. Integrated high voltage switches that are of the same conductivity type and do not algebraically combine signals for certain modes of operation would contribute to lower cost and improve reliability for gas panel displays and the like.

SUMMARY OF THE INVENTION

One object of the invention is an integrated monolithic switch having improved performance for controlling high voltage signals and sinking current to/from a utilization circuit.

Another object is an integrated monolithic switch imbedded in an epitaxial layer which incorporates a load resistor.

Another object is an integrated monolithic switch which can control both the row and column conductors of a gas panel display.

Another object is an integrated monolithic switch having a low output voltage when sinking current.

In an illustrative embodiment, a semiconductor substrate includes an epitaxial layer in which a plurality of switches of the same conductivity type are imbedded. Each switch is connected between an upper and a lower high voltage level. The output of each switch is connected to a utilization circuit, e.g. a row or column conductor in a gas panel matrix. Each switch further comprises an input amplifier, typically a Darlington pair for controlling a power output switch. An epitaxial resistor connected to a voltage supply provides current to the Darlington amplifier and biases the power output switch. The Darlington input stage is also connected to the output terminal in order to lower the output voltage when the Darlington is conducting. A bilateral device, typically a diffused diode is suitably connected between the output switch and the Darlington amplifier. The bilateral device is formed in the semiconductor to create a parasitic path between the output terminal and the semiconductor substrate when the switch is sinking current from the utilization circuit.

When a first output signal is supplied to precondition the Darlington amplifier, the output switch is turned OFF and the output terminal is connected to the lower high voltage line. The upper and lower high voltage lines are brought up and the output terminals follows the voltage on the lower high voltage line. A second input signal preconditions the Darlington amplifier to the opposite state. The higher voltage lines are brought up and the output switch connects the upper high voltage line to the output terminal. When sinking current is present from the utilization circuit the diffused diode is forward biased. The diode forms a parasitic path to the semiconductor substrate. The parasitic path to the substrate shares current with the Darlington output stage thereby lowering the voltage at the output stage even through the high voltage lines may be up. The parasitic path is also in parallel relation to the Darlington output transistor which lowers the saturation voltage of this device.

One feature of the invention is a semiconductor substrate including an epitaxial layer of appropriate resistivity and thickness which will accommodate a load resistor and appropriate active devices that will not breakdown in the face of relatively high voltages.

Another feature is a bilateral device, typically a diffused diode connected between the output terminals of the power output switch and the Darlington amplifier and constructed in the semiconductor to form a parasitic path to substrate for sinking current from the utilization circuit.

Another feature is the high voltage switch including a Darlington amplifier connected to the output terminal to lower output voltage when the switch is in a selected condition.

BRIEF DESCRIPTION OF THE DRAWING

The invention and its further objects and features will be more fully understood from the following detailed description taken in conjunction with the drawing in which:

FIG. 2a is an electrical schematic of a pair of circuits of the type shown in FIGS. 1a and 1b as drivers for a selected cell in a gas panel display in a write mode.

FIG. 2b is an electrical schematic of a pair of circuits shown in FIGS. 1a and 1b as drivers for a deselected cell in a gas panel display in a write mode.

FIG. 2c is an electrical schematic of a pair of circuits shown in FIGS. 1a and 1b as drivers for a cell in a gas panel display in a sustain mode.

It will be understood that although the following devices and processes are described in terms of a single switch, each device comprises a plurality of switches fabricated in a semiconductor wafer which is subsequently divided into several hundred of individual devices.

DESCRIPTION OF PREFERRED EMBODIMENT

Figure 1A:
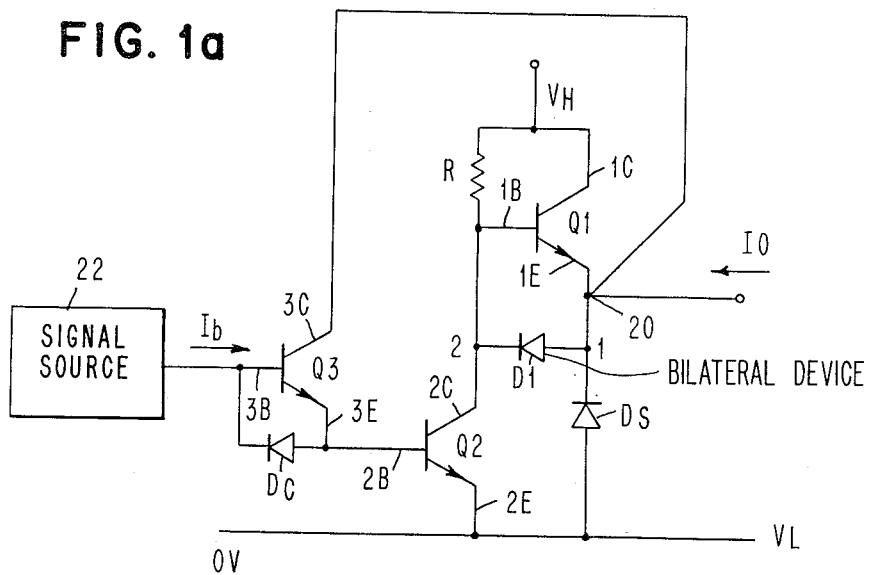
FIG. 1a is an electrical schematic of a circuit employing the principles of the present invention.

FIG. 1a shows an integrated monolithic switch for high voltage applications including a power output switch Q1 comprising a collector electrode 1C, base electrode 1B and emitter electrode 1E. The collector electrode 1C is connected to an upper high voltage line $V_H$. The base electrode 1B is biased from a resistor R, the other end which is connected to $V_H$. The emitter electrode 1E is connected to an output terminal 20 and to one end of a sourcing diode $D_S$. The other end of the diode $D_S$ is connected to a lower high voltage line $V_L$. The lines $V_H$ and $V_L$ are connected to high voltage supplies (not shown) which preferably provide variable voltage pulses from near zero to several hundred volts, as determined by the switch condition. A Darlington pair, Q2 and Q3, drive the base electrode 1B of the output switch Q1. Q2, the Darlington output device, includes aa collector electrode 2C which is directly connected to the base electrode 1B. Q2 also includes an emitter electrode 2E which is directly connected to $V_L$. A base electrode 2B is directly connected to the Darlington input device Q3 at an emitter electrode 3E. Q3 also includes a collector elecctrode 3C and a base electrode 3B, the former being connected to the output terminal 20 and the latter being connected to a signal source 22. The base electrode connection to the output terminal 20 lowers the output voltage when the switch is in a selected condition. A diode $D_C$ is connected between the electrodes 3E and 3P for discharging the electrode 2B when Q2 is OFF.

A bilateral device, typically a PN diode D1 is connected between the output terminal 20 and the common connection between the electrodes 1B and 2C. The diode functions as a substrate switch to sink current ($I_o$) from a utilization circuit (not shown) connected to the output terminal 20. The substrate switch directs current to the substrate and lowers the saturation voltage of the Darlington output transistor by sharing the current which would otherwise flow to Q2. In the absence of the substrate current path, Q2 would have a higher saturation voltage when conducting.

When the Darlington amplifier is OFF, the power output switch serves as a wave shaper for the signals on the electrodes 1B and 1C and enables the output terminal 20 to act as a source.

In operation, a positive input signal to the base electrode 3B turns ON Q3 which in turn turns ON Q2. Q1 is turned OFF which results in the voltage at the output terminal following the voltage at $V_L$. Q3 contributes to lowering voltage drop between the terminal 20 and $V_L$. When a negative input signal is provided to the base electrode 3B, Q3 turns OFF which in turns turns OFF Q2. Q1 turns On which results in the output voltage at the terminal 20 following the voltage at $V_H$.

Figure 1B:
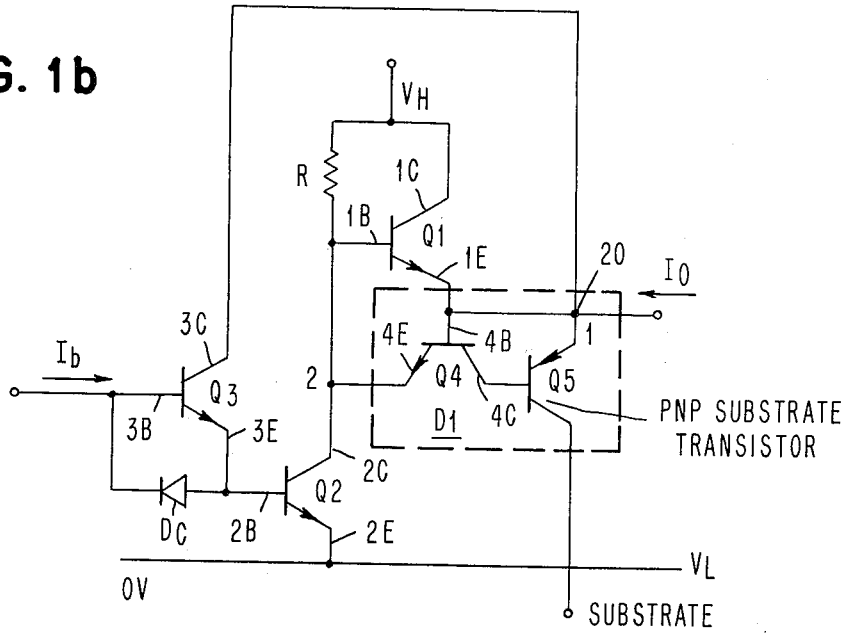
FIG. 1b is an electrical schematic of another version of the circuit of FIG. 1a when sinking current from a utilization circuit.

FIG. 1b shows the condition of FIG. 1a when a sinking current $I_o$ is present at the terminal 20. The sinking current forward biases the diode D1, the structure of which will be described later. The diode D1 becomes an emitter-base of a transistor Q4 and the emitter of a transistor Q5. When Q4 is turned on by the sinking current, Q5 is turned ON by the flow of collector current in Q4. Q5 directs the greater portion of the sinking current to the substrate. Current through Q4 is directed to $V_L$ through Q2. This feature lowers the voltage at the terminal 20 which permits the high voltage switch to form a better current sink. The output voltage is also lowered when the Darlington pair is in conducting state due to the connection between the collector 3C and the output terminal 20, as previously indicated.

FIG. 2a shows the current flow to a cross point in a gas panel matrix. Gas panel display systems are described in U.S. Pat. No. 3,597,758 assigned to the same assignee as that of the present invention. Voltage pulses shown in FIG. 2a are supplied to the $V_H$ and $V_l$ lines of a pair of circuits of the type shown in FIG. 1a and identified as "x" and "y" drivers. The current flow is from the "x" to the "y" driver. A voltage differential is established across the cross point of a selected cell. The voltage is of the order of 170 volts and is sufficient to generate a gas glow at the cross point for a write condition for the panel. The write condition is initiated when Q2 is OFF for the "x" driver and Q2 is ON for the "y" driver. To prevent a gas glow at the cross point, Q2 for the "x" driver is turned ON while Q2 for the "y" driver is turned OFF as shown in FIG. 2b. The voltage pulses at the "x" and "y" drivers creates a voltage differential of about 70 volts across the gas panel cross point which is insufficient to establish a gas flow. When a glow is established, the "x" and "y" drivers are adapted to sustain the glow at a cross point at a lower power condition, as shown in FIG. 2c. In this condition, the "x" and "y" drivers are ON and the current is sourced from diode $D_S$ of the "x" driver to diode D1 of the "y" driver. The diode D1 of the "y" driver functions as a substrate switch. A parasitic path is formed by the switch to sink current to the substrate, as will be more fully described hereafter. During the sustain mode, $V_H$ and $V_L$ for the "x" driver is simultaneously pulsed with an appropriate voltage, typically 100 volts. The $V_H$ and $V_L$ lines for the "y" drivers are at a reference level, typically ground. The sustaining current can also be maintained by supplying the "x" signals and voltage pulses to the "y" drivers and high voltage lines ($V_H$, $V_L$) and "y" signals and reference levels to the "x" drivers and high voltage lines ($V_H$, $V_L$).

Figure 3A:
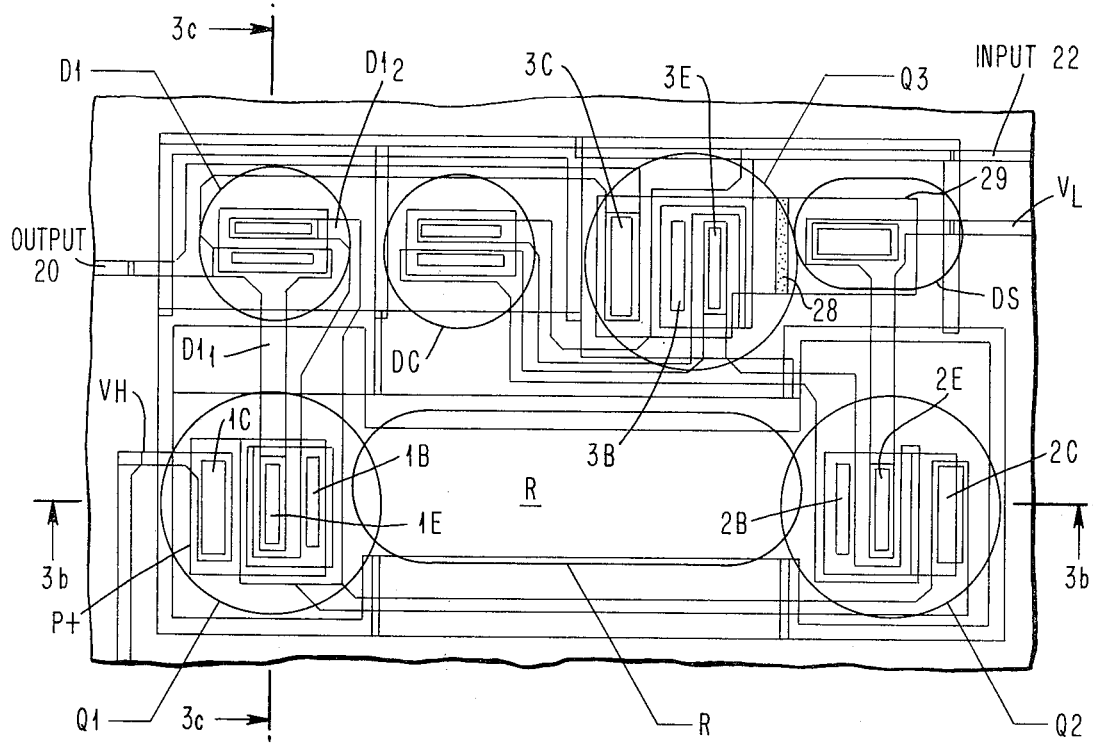
FIG. 3a is a plan view of topology for the circuit shown in FIG. 1a embodied in a semiconductor substrate.

FIG. 3a shows the circuit of FIG. 1a imbedded in a semiconductor substrate. Elements in FIG. 3a have the same reference designations as those shown in FIG. 1a. Q1 and Q2 are the power output switch and the Darlington output transistor, respectively. An epitaxial resistor R connects the collectors of both Q1 and Q2. Collector contact 1C directly contacts resistor R as well as receiving an input from voltage supply $V_H$. Emitter contact 1E connects with terminal D1$_1$ of the diode D1. Base contact 1B connects to the terminal D1$_2$ of diode D1 as well as to the collector contact 2C. Emitter contact 2E connects to the voltage supply $V_L$ as well as to one terminal of the diode $D_S$. Base contact 2B connects to the emitter contact 3E and to one side of the diode $D_C$. An isolation barrier 28 extends across the subcollector 29 to prevent a PNP transistor being formed between the diode $D_S$ and Q3. FIG. 3a also shows base contact 3B connected to the other side of diode $D_C$ and to the input terminal 22. Collector contact 3C is connected to the output terminal 20 and the terminal D1$_1$.

Figure 3B:
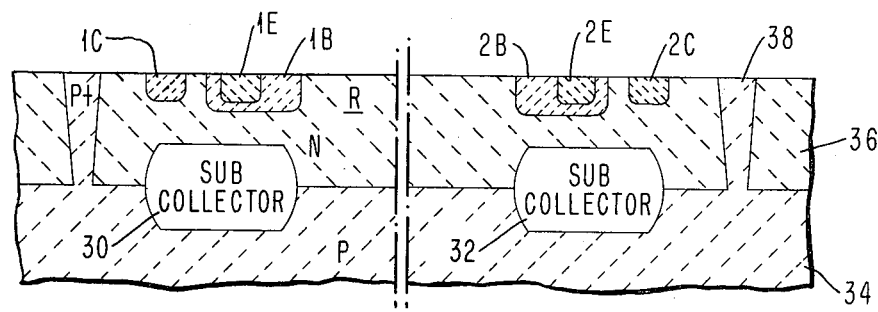
FIG. 3b is a cross sectional view of FIG. 3a along the line 3b—3b.

FIG. 3b shows subcollector regions 30 and 32 beneath the devices Q1 and Q2. Q3, not shown, includes the subcollector 29, as previously described in FIG. 3a. Each subcollector extends into a P substrate 34 which supports an N type epitaxial region 36 in which the circuit of FIG. 1a is imbedded. A P+ isolation region 38 surrounds each circuit. FIG. 3b also shows the various electrodes of the transistors Q1 and Q2 as well as the resistor R which connects the collectors 1C and 2C.

Figure 3C:
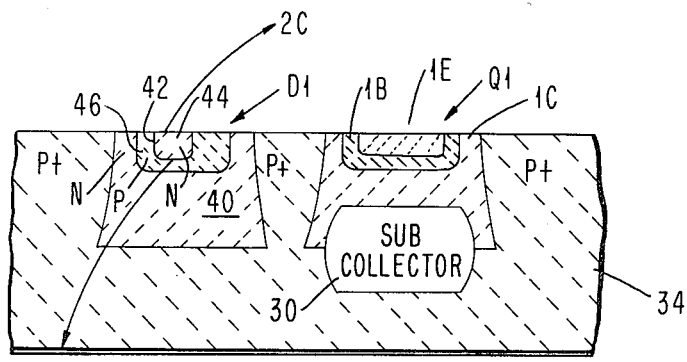
FIG. 3c is a cross sectional view of FIG. 3a along the line 3c—3c.

FIG. 3c shows the diode D1 and the transistor Q1. The diode D1 is enclosed by an N region 40 which floats electrically since it is unconnected. A junction 42 of diode D1 is the emitter-base of the NPN transistor Q4, shown in FIG. 1a, the latter comprising regions 44, 46 and 40, respectively. The regions 46, 40 and 34 form the emitter, base and collector, respectively of the PNP transistor Q5 shown in FIG. 1a. When sinking current $I_o$ is present at the region 44, the junction 42 is forward biased to cause the NPN transistor Q4 to conduct. Current flow in the NPN collector or region 40 forward biases the PNP transistor Q5 to direct the sinking current to the substrate 34 which is biased at an appropriate potential. Sinking current at the region 44 also flows to the collector contact 2C (see FIG. 3a) as the emitter current of the NPN transistor Q4.

The integrated monolithic switch is fabricated by suitably lapping and polishing a silicon monocrystalline substrate, typically of P type conductivity aand approximately 15 ohm — centimeter resistivity. Subcollector regions are formed in the substrate by conventional semiconductor processes. An epitaxial layer is formed on the substrate by conventional processes. The layer is formed to a thicknss of approximately 15 microns at a resistivity of 5 ohm — centimeters. This thickness and resistivity are sufficient to permit all active and passive elements of the circuit shown in FIG. 1a to be imbedded in the layer. The resistivity is sufficient to prevent breakdown of the devices in the face of the voltages appearing on the lines $V_H$ and $V_L$ connected to the devices, as shown in FIG. 1a. The load resistor R is also incorporated into the layer by well known processes. Metallization is formed on the layer by well known processes and establishes the electrical connections among the elements to complete the switch. All active devices in the layer are of the same conductivity type.

While NPN transistors have been shown, it is apparent that PNP transistors may be formed in the layer. In such case, the diode D1 would form an PNP transistor to substrate. The circuit design and device configuration make available voltage switches that are simple to fabricate and eliminate the need for (1) algebraically combining input signals to a driver and (2) switches of different semiconductor conductivity types to operate a cross point in a gas panel display.

While the invention has been particularly shown and described with reference to preferred embodiments thereof, it will be understood by those skilled in the art that the foregoing and other changes in form and details may be made therein without departing from the spirit and scope of the invention.

What is claimed is:
1. An integrated monolithic switch comprising
   a. a semiconductor substrate of a first conductivity type,
   b. an epitaxial layer of a second conductivity type united to the substrate,
   c. isolation rings of the first conductivity type disposed in the layer to establish a plurality of pockets of second conductivity type,
   d. an input amplifier disposed in a first pocket and coupled to an output terminal,
   e. a power output switch disposed in the first pocket and connected to the output terminal, a unilateral conducting device disposed in a second pocket and coupled to the output terminal,
   f. first and second conductors adhered to the layer, and
   g. means for receiving first and second input signals to the input amplifier in said first pocket whereby the first input signal connects the output terminal to the first conductor through the power switch and the second input signal connects the output terminal to the second conductor through the unilateral conducting device in the second pocket.

2. The integrated monolithic switch of claim 1 further including a resistor disposed in the first pocket, the resistor connecting the first conductor to the input amplifier and serving as a bias resistor for the power output switch.

3. The integrated monolithic switch of claim 1 wherein a PN diode is disposed in a third pocket and connected to the output terminal and to the input amplifier, the PN diode being adapted to form a parasitic path to the substrate when a sinking current is present at the output terminal.

4. The integrated monolithic switch of claim 3 wherein the input amplifier is a Darlington pair comprising a Darlington input amplifier in the second pocket and a Darlington output amplifier in the first pocket, the Darlington input amplifier being connected to the output terminal.

5. The integrated monolithic switch of claim 3 wherein the PN diode disposed in the third pocket comprises regions of first and second conductivity types disposed in a region of second conductivity type and being adapted to form a first transistor connected between the output terminal and the Darlington output amplifier in the first pocket and a second transistor connected between the output terminal and a reference supply connected to the substrate.

6. The integrated monolithic switch of claim 5 whereien the epitaxial layer has a thickness of the order of 5 microns and a resistivity of the order of 15 ohm — centimeters.

7. An integrated high voltage switch comprising
   a. a semiconductor substrate of a first conductivity type,
   b. an epitaxial layer of a second conductivity type united to the substrate,
   c. isolation rings of a first conductivity type disposed in the layer to establish a plurality of pockets of the second conductivity type,
   d. first and second voltage supply leads disposed on the layer,
   e. an input amplifier disposed in a first pocket,
   f. a power switch disposed in the first pocket, a unilateral conducting diode disposed in a second pocket and connected to an output terminal,
   g. means connecting the input amplifier between one voltage supply line and the input to the power switch,
   h. means connecting the power switch between the other voltage supply lead and the output terminal, and
   i. a third pocket of the second conductivity type including a PN diode, one side of the diode connected to the output terminal and the other side of the diode connected to the input to the power switch.

8. The high voltage switch of claim 7 wherein an input current at the output terminal is discharged through the diode by a first path to the first voltage supply line and by a second path to the substrate.

9. The integrated high voltage switch of claim 7 wherein the PN diode comprises first and second regions of opposite conductivity types within the third pocket of second conductivity type.

10. The high voltage switch of claim 9 wherein an input current at the output terminal biases the first conductivity region to form an NPN transistor which discharges part of the input current to the first voltage supply line, the input current further biasing the first conductivity region to form a PNP transistor which discharges the remainder of the input current to the substrate.

11. The high voltage switch of claim 7 wherein the input amplifier is also connected to the output terminal.

12. The high voltage switch of claim 7 wherein an epitaxial resistor is disposed in the first pocket to connect the second voltage supply line to the input of the power switch.

13. The high voltage switch of claim 12 wherein a diode is disposed in a fourth pocket and isolated from the second pocket, the diode being connected to the input of the input amplifier in the first pocket.

14. The high voltage switch of claim 13 wherein the input amplifier comprises first and second transistors disposed in the first and second pockets and connected as a Darlington pair, one output of the Darlington pair being connected to the input of the power switch and the other output of the Darlington pair being connected to the output terminal.

15. The high voltage switch of claim 14 wherein the epitaxial layer has a thickness of the order of 5 microns and a resistivity of the order of 15 ohm centimeters to withstand high voltage stresses of the order of 100 volts across the active and passive elements imbedded in the layer.

* * * * *